United States Patent [19]

Takanezawa et al.

[11] Patent Number: 5,053,280

[45] Date of Patent: Oct. 1, 1991

[54] ADHESIVE COMPOSITION FOR PRINTED WIRING BOARDS WITH ACRYLONITRILE-BUTADIENE RUBBER HAVING CARBOXYL GROUPS AND 20 PPM OR LESS METAL IONIC IMPURITIES; AN ALKYL PHENOL RESIN; AN EPOXY RESIN; PALLADIUM CATALYST, AND COUPLING AGENT

[75] Inventors: Shin Takanezawa; Yorio Iwasaki, both of Shimodate; Hiroshi Takaahashi, Kasama; Toshiro Okamura, Shimodate; Saburo Amano; Hiroyoshi Yokoyama, both of Yuki; Noriyoshi Fukuoka, Takaoka; Tatsuya Amano, Moda, all of Japan

[73] Assignee: Hitachi-Chemical Co., Ltd., Japan

[21] Appl. No.: 408,688

[22] Filed: Sep. 18, 1989

[30] Foreign Application Priority Data

Sep. 20, 1988 [JP] Japan ................................. 63-235196

[51] Int. Cl.$^5$ .............................................. B32B 27/38
[52] U.S. Cl. ..................................... 428/413; 428/209; 428/901; 427/96; 427/404; 427/407.1; 106/1.11
[58] Field of Search .................. 525/109; 427/98, 404, 427/411, 407.1; 428/416, 460, 462, 209, 901, 413; 106/1.11

[56] References Cited

U.S. PATENT DOCUMENTS

| | | | |
|---|---|---|---|
| 3,625,758 | 12/1971 | Stahl et al. | 428/206 |
| 3,772,056 | 11/1973 | Polichette et al. | 430/324 |
| 3,776,978 | 12/1973 | Markovitz | 428/416 |
| 3,907,621 | 9/1975 | Polichette et al. | 156/656 |
| 3,925,578 | 12/1975 | Polichette et al. | 327/304 |
| 3,978,252 | 8/1976 | Lombardo et al. | 427/299 |
| 3,993,802 | 11/1976 | Polichette et al. | 427/304 |
| 4,204,013 | 5/1980 | Arcilesi et al. | 427/304 |
| 4,216,246 | 8/1980 | Iwasaki et al. | 427/404 |
| 4,306,930 | 12/1981 | Cowell et al. | 428/462 |
| 4,492,730 | 1/1985 | Oishi et al. | 428/460 |
| 4,522,850 | 6/1985 | Leech | 427/304 |
| 4,610,910 | 9/1986 | Kawamoto et al. | 428/209 |
| 4,681,630 | 7/1987 | Brasch | 106/1.11 |
| 4,762,560 | 8/1988 | Brasch | 106/1.11 |
| 4,971,863 | 11/1990 | Hart | 428/458 |

OTHER PUBLICATIONS

Derwent Publications, Ltd., London; Abstract & JP-A-61-213 277 (Sumitomo Bakelite).
Derwent Publications, Ltd., London; Abstract & JP-A-60-068 935 (Hitachi Chemical).
Derwent Publications, Ltd., London; Abstract & JP-A-21-100 445 (Hitachi Kasei Polym).

*Primary Examiner*—Michael Lusignan
*Assistant Examiner*—Diana Dudash
*Attorney, Agent, or Firm*—Antonelli, Terry, Stout and Kraus

[57] ABSTRACT

An adhesive composition for producing printed wiring boards comprising (A) acrylonitrile-butadiene rubber having carboxyl groups in the molecule and containing 20 ppm or less of metal ionic impurities, (B) an alkyl phenol resin, (C) an epoxy resin, (D) a catalyst for electroless plating, and (E) a coupling agent having an ethylene or vinyl group, is useful in a so-called additive process.

4 Claims, No Drawings

ADHESIVE COMPOSITION FOR PRINTED WIRING BOARDS WITH ACRYLONITRILE-BUTADIENE RUBBER HAVING CARBOXYL GROUPS AND 20 PPM OR LESS METAL IONIC IMPURITIES; AN ALKYL PHENOL RESIN; AN EPOXY RESIN; PALLADIUM CATALYST, AND COUPLING AGENT

BACKGROUND OF THE INVENTION

This invention relates to an adhesive composition for printed wiring boards wherein necessary wiring patterns are formed by electroless plating, and excellent in resistance to electrolytic corrosion and storage stability.

Printed wiring boards wherein necessary wiring patterns are formed by electroless plating are obtained by an additive process using an insulating substrate having thereon an adhesive on necessary portions and forming thereon wiring patterns by electroless plating. For example, an additive process-produced printed wiring board is obtained by forming an adhesive layer containing a catalyst for electroless plating on a surface of an insulating substrate made from a resin containing a catalyst for electroless plating, masking portions other than circuit portions with a resist, chemically roughening exposed portions of the adhesive layer with an acidic etching solution such as chromic acid-sulfuric acid, neutralizing, washing with water and conducting electroless plating.

As the adhesive for electroless plating there are used compositions comprising acrylonitrile-butadiene rubber or acrylonitrile-butadiene rubber having carboxyl groups at both ends, excellent in adhesiveness to deposited copper, as a major component, and a thermosetting resin such as heat-resistant alkyl phenol resin, epoxy resin, or the like, and if necessary, an inorganic filler for helping reinforcement of adhesive coating and chemical roughening, as disclosed in Japanese Patent Examined Publication Nos. 48-24250, 45-9843, 45-9996, 55-16391, and 52-31539, and Japanese Patent Unexamined Publication No. 51-28668. Further, as the adhesive for electroless plating without conducting seeding, there is proposed in U.S. Pat. No. 4,522,850 a composition comprising acrylonitrile-butadiene rubber or acrylonitrile-butadiene rubber having carboxyl groups at both ends, excellent in adhesiveness to deposited copper, as a major component, a thermosetting resin such as heat-resistant alkyl phenol resin or epoxy resin and a filler having a catalytic property for electroless plating. But these adhesives are insufficient for conducting the additive process. Particularly, when a conventionally used palladium-containing catalyst for electroless plating is mixed with the adhesive for conducting the additive process without seeding, the catalytic property is lost in a short time by the reaction of palladium and the carboxyl group.

On the other hand, with a recent demand for miniaturization and lighter weight of electronic appliances, a higher density of wiring has also been required for printed wiring boards. As a result, distances between wiring conductors become narrower, which results in causing a problem of readily bringing about electrolytic corrosion wherein conductors are migrated by various treating solutions remaining on the surface or interior of an insulating substrate supporting the conductors and activated by an electric field applied between conductors. Therefore, it is impossible to make the distance between conductors 0.15 mm or less, resulting in difficulty in realizing higher density of wiring.

The electrolytic corrosion seems to be caused by ionic impurities contained in the adhesive layer formed on the substrate or treating solutions specific for producing printed wiring boards by the additive process, these ionic impurities and treating solutions being activated by an electric field applied between conductors under circumstances of high temperatures and high humidity, resulting in migrating copper.

SUMMARY OF THE INVENTION

It is an object of the present invention to provide an adhesive composition for printed wiring boards useful for producing high density printed wiring boards by the additive process and excellent in prevention of electrolytic corrosion and storage stability of the adhesive composition.

The present invention provides an adhesive composition for printed wiring boards wherein necessary circuit patterns are formed by electroless plating comprising (A) acrylonitrile-butadiene rubber having carboxyl groups in the molecule and containing 20 ppm or less of metal ionic impurities, (B) an alkyl phenol resin, (C) an epoxy resin, (D) a catalyst for electroless plating selected from metallic palladium or a salt of palladium or a mixture thereof, and (E) a coupling agent having an ethylene group or a vinyl group.

The present invention also provides a printed wiring board obtained by an additive process using the adhesive composition mentioned above.

DESCRIPTION OF THE PREFERRED EMBODIMENTS

The adhesive composition for printed wiring boards by the additive process comprises (A) acrylonitrile-butadiene rubber having carboxyl groups in the molecule and containing 20 ppm or less of metal ionic impurities preferably in an amount of 30 to 70% by weight, (B) an alkyl phenol resin preferably in an amount of 10 to 40% by weight, (C) an epoxy resin preferably in an amount of 5 to 50% by weight, (D) a catalyst for electroless plating selected from metallic palladium or a salt thereof, or a mixture thereof preferably in an amount of 1 to 10% by weight, and (E) a coupling agent having an ethylene group or a vinyl group.

The acrylonitrile-butadiene rubber having carboxyl group in the molecule and containing 20 ppm or less of metal ionic impurities can be prepared by making additives such as emulsifiers, coagulants, antioxidants, etc. nonionic in the course of copolymerization of acrylonitrile, butadiene, and a compound having carboxyl group(s), and carrying out the reaction in a conventional manner so as not to introduce other ionic impurities into the reaction system with much care. As a result, the content of metal ionic impurities in the resulting copolymer is controlled to 20 ppm or less. When the content of metal ionic impurities is more than 20 ppm, the migration of copper is easily accelerated by an voltage applied between conductors after formation of conductors as a wiring board, which results in lowering in resistance to electric corrosion. The content of the carboxyl group is preferably 3% by weight or more.

The content of the component (A) in the adhesive composition (based on a total weight of solid contents except for an organic solvent) is preferably 30 to 70% by weight. When the content is less than 30% by weight, there is a tendency to lower the adhesive strength to the deposited plated copper, while when the content is more than 70%, there is a tendency to lower heat resistance.

As the alkyl phenol resin (B), there can be used a resin obtained from p-substituted alkyl phenol such as, p-cumyl phenol, amyl phenol, butyl phenol, sec-butyl phenol, octyl phenol, etc., by a conventional method.

The content of the alkyl phenol resin based on the weight of the solid contents of the adhesive composition except for an organic solvent is preferably in the range of 10 to 40% by weight. When the content is less than 10% by weight, there is a tendency to lower heat resistance due to insufficient crosslinking with the rubber. On the other hand, when the content is more than 40% by weight, there is a tendency to lower adhesive strength to the deposited plated copper.

As the epoxy resin (C), there can be used any types of epoxy resins such as bisphenol A epoxy resins, novolak type epoxy resins, etc. The content of the epoxy resin based on the weight of the solid contents of the adhesive composition except for an organic solvent is preferably in the range of 5 to 50% by weight. When the content is less than 5% by weight, there is a tendency to lower resistance to electrolytic corrosion due to insufficient reaction with the carboxyl group in the rubber. On the other hand, when the content is more than 50% by weight, there is a tendency to lower adhesive strength of the deposited copper.

As the catalyst for electroless plating (D), there can be used metallic palladium, a salt of palladium such as palladium chloride, etc., and a mixture thereof.

The amount of the catalyst (D) is preferably 1 to 10% by weight based on the weight of the adhesive composition. When the amount is less than 1% by weight, deposition of plating is lowered, while when the amount is more than 10%, insulation resistance is lowered.

As the coupling agent having an ethylene group (E), there can be used diisostearoyl ethylene titanate, bis(dioctyl pyrophosphate) ethylene titanate, etc.

As the coupling agent having a vinyl group (E), there can be used vinyltrimethoxysilane, vinyltris(2-methoxyethoxy)silane, vinyltriethoxysilane, vinyltris($\beta$-methoxyethoxy)silane, vinyltrichlorosilane, etc.

Coupling agents having a functional group other than the ethylene group and the vinyl group, for example, an amino group, a cyclic epoxy group, a glycidoxy group, or a mercapto group, are small in effect for suppressing the reaction between the carboxyl group in the acrylonitrile-butadiene rubber and the palladium in a catalyst for electroless plating, and instead reacts with an epoxy resin in an adhesive at room temperature to deteriorate storage stability.

The weight ratio of the electroless plating catalyst to the coupling agent having an ethylene or vinyl group is preferably 10:0.05 to 10:5. When the ratio is less than 10:0.05, there is a tendency to lower storage stability of the adhesive composition due to the reaction of the carboxyl group in the rubber with the palladium in the catalyst at room temperature. On the other hand, when the ratio is more than 10:5, the prevention effect of the reaction between the carboxyl group and the palladium is not changed, so that such a ratio is not preferably economically.

The adhesive composition is practically used as a liquid form mixture by kneading or mixing the components in an organic solvent.

As the organic solvent, there can be used toluene, methyl ethyl ketone, xylene, diethylene glycol monomethyl ether, diethylene glycol monoethyl ether, diethylene glycol monoethyl ether acetate, ethyl acetate, etc. These solvents can be used alone or as a mixture thereof.

The adhesive composition may further contain one or more inorganic fillers such as fine powdered silica, zirconium silicate, silica, calcium carbonate, talc, etc., in order to form unevenness easily when the adhesive layer is chemically roughened and to improve adhesive strength.

When the adhesive composition of the present invention is used, since the acrylonitrile-butadiene rubber having carboxyl groups in the molecule reacts not only with the phenol resin, but also with the epoxy resin or the reaction among carboxyl groups takes place so as to increase the crosslinking degree of the rubber, migration of copper ions can be prevented to suppress electrolytic corrosion. Further, since the coupling agent having an ethylene or vinyl group suppresses the reaction of the carboxyl group with palladium, the storage stability of the adhesive composition is improved.

By using the adhesive composition of the present invention, a printed wiring board can be produced by forming an adhesive layer on one side or both sides of an insulating substrate containing a catalyst for electroless plating, masking portions other than circuit portions with a resist, chemically roughening non-masked portions, and conducting electroless plating on the roughened portions.

The present invention is illustrated by way of the following Examples, in which all parts and percents are by weight, unless otherwise specified.

EXAMPLE 1

An adhesive solution (solid content 25%) was prepared by dissolving the following ingredients in a mixed solvent of Cellosolve acetate and methyl ethyl ketone using a kneader and a stirrer.

| (A) | carboxyl group-containing acrylonitrile-butadiene rubber (PNR-1, mfd. by Japan Synthetic Rubber Co., Ltd. metal ionic impurities $\leq$ 20 ppm) | 60 parts |
| (B) | Alkyl phenol resin (SP-126, mfd. by Schenectady Chemicals, Inc.) | 25 parts |
| (C) | Bisphenol A type epoxy resin (Epikote 1001 FR, mfd. by Yuka Shell Epoxy Co., Ltd. | 20 parts |
| (D) | Palladium chloride-containing epoxy resin (PEC-8, mfd. by Hitachi Chemical Co., Ltd.) | 6 parts |
| (E) | Bis(dioctylpyrophosphate)ethylene titanate (KR-238S, mfd. by Ajinomoto Co., Ltd.) | 1 part |
| (F) | Zirconium silicate (Micropacks 20A, mfd. by Hakusui Chemical Industries, Ltd.) | 30 parts |

The adhesive solution was coated on both sides of a paper base epoxy resin insulating substrate (LE-144, mfd. by Hitachi Chemical Co., Ltd.) by dipping so as to make the film thickness after dried about 25 $\mu$m, dried at 170° C. for 60 minutes to give an adhesive-coated insulating substrate.

On the resulting substrate, a photoresist for electroless plating (SR-3000, mfd. by Hitachi Chemical Co., Ltd.) was laminated, followed by exposure to ultraviolet light and development to form a resist for electroless plating so as to make the adhesive layer to be exposed to a comb-type pattern having a conductor width of 0.2 mm and a conductor distance of 0.2 mm, a pattern of 5 mm wide, and a pattern of 25 mm in a side, respectively. The exposed adhesive layer was chemically roughened by dipping in chromic acid-sulfuric acid (55 g of chromic acid, 220 ml of concentrated sulfuric acid and water, a total amount being 1 liter) at 40° C. for 15 minutes, followed by washing with water for neutralization.

The resulting substrated was dipped in an electroless copper plating solution (CC-41, mfd. by Hitachi Chemical Co., Ltd.) to form electrolessly plated copper of about 30 μm thick. Thus, a test piece of a printed wiring board was produced by the additive process.

EXAMPLE 2

An adhesive solution was prepared by using the following ingredients in the same manner as described in Example 1. A test piece was also produced in the same manner as described in Example 1.

| (A) | Carboxyl group-containing acrylonitrile-butadiene rubber (PNR-1) | 55 parts |
|---|---|---|
| (B) | Alkyl phenol resin (SP-126) | 25 parts |
| (C) | Epoxy resin (DEN-438, mfd. by Dow Chemical Co.) | 30 parts |
| (D) | Palladium chloride-containing epoxy resin (PEC-8) | 6 parts |
| (E) | Ethylene group-containing coupling agent (KR-238S) | 1 part |
| (F) | Inorganic filler (Micropacks 20A) | 30 parts |

EXAMPLE 3

An adhesive solution was prepared by using the following ingredients in the same manner as described in Example 1. A test piece was also produced in the same manner as described in Example 1.

| (A) | Carboxyl group-containing acrylonitrile-butadiene rubber (PNR-1) | 65 parts |
|---|---|---|
| (B) | Alkyl phenol resin (Hitanol 2400, mfd. by Hitachi Chemical Co., Ltd.) | 15 parts |
| (C) | Epoxy resin (Epikote 1001 FR) | 30 parts |
| (D) | Palladium catalyst for electroless plating (PEC-8) | 6 parts |
| (E) | Ethylene group-containing coupling agent (KR-238S) | 0.6 part |
| (F) | Silica silicate (Crystalite VX-X, mfd. by Tatsumori K.K.) | 30 parts |

COMPARATIVE EXAMPLE 1

The process of Example 1 was repreated except for using a carboxyl group-not-containing acrylonitrile-butadiene rubber (N-230S, mfd. by Japan Synthetic Rubber Co., Ltd.) in place of the carboxyl group-containing acrylonitrile-butadiene rubber (PNR-1).

COMPARATIVE EXAMPLE 2

The process of Example 1 was repeated except for not using the ethylene group-containing coupling agent (KR-238S).

The adhesive solutions mentioned above were allowed to stand in a constant temperature bath maintained at 50° C. for 30 days to measure viscosity changes (storage stability).

Evaluation was made as follows:

○: viscosity increasing rate, less than 15%
Δ: viscosity increasing rate, 15% or more and less than 30%
x: viscosity increasing rate, 30% or more The test pieces of wiring boards were subjected to the following tests.

INSULATION RESISTANCE

Resistance to electrolytic corrosion was measured by applying a direct current of 100 V to electrodes of comb-like pattern having a conductor width of 0.2 mm and conductor distance of 0.2 mm at 85° C. and a humidity of 85% RH to measure changes in insulation resistance after a predetermined time. In order to prevent attachment of waterdrops between electrodes during the test, a solder resist was print coated on the front side of a test piece.

PEELING STRENGTH

A pattern conductor of 5 mm width was measured according to JIS C-6481.

SOLDER HEAT RESISTANCE

A pattern conductor having a side of 25 mm was subjected to the measurement of time not generating blisters at 260° C. according to JIS C-6481.

The results are shown in Table 1.

TABLE 1

| Example No. | Insulation resistance (ohm) Initial time | Insulation resistance (ohm) After 300 hrs. | Solder heat resistance (sec) | Peeling strength (kgf/cm) | Storage stability of adhesive solution |
|---|---|---|---|---|---|
| Example 1 | $7.2 \times 10^{12}$ | $2.0 \times 10^{12}$ | $\geq 120$ | 1.8 | ○ |
| Example 2 | $6.5 \times 10^{12}$ | $1.1 \times 10^{12}$ | $\geq 120$ | 1.7 | ○ |
| Example 3 | $6.0 \times 10^{12}$ | $1.5 \times 10^{12}$ | $\geq 120$ | 1.8 | ○ |
| Comparative Example 1 | $2.1 \times 10^{11}$ | $\leq 1.0 \times 10^{7}$ | $\geq 120$ | 2.0 | ○ |
| Comparative Example 2 | $6.4 \times 10^{12}$ | $1.9 \times 10^{12}$ | $\geq 120$ | 1.8 | x |

EXAMPLE 4

The process of Example 1 was repeated except for using 1 part of vinyltris(2-methoxyethoxy)silane (A-172, a trade name mfd. by Nippon Unicar Co., Ltd.) in place of the coupling agent (KR-238S).

EXAMPLE 5

The process of Example 2 was repeated except for using 1 part of vinyltriethoxysilane (A-151, a trade name mfd. by Nippon Unicar Co., Ltd.) in place of the coupling agent (KR-238S).

The results are shown in Table 2.

TABLE 2

| Example No. | Insulation resistance (ohm) | | Solder heat resistance (sec) | Peeling strength (kgf/cm) | Storage stability of adhesive strength |
| --- | --- | --- | --- | --- | --- |
| | Initial time | After 300 hrs. | | | |
| Example 4 | $6.3 \times 10^{12}$ | $1.5 \times 10^{12}$ | $\geq 120$ | 1.7 | o |
| Example 5 | $6.5 \times 10^{12}$ | $1.2 \times 10^{12}$ | $\geq 120$ | 1.8 | o |

As mentioned above, the adhesive composition of the present invention is excellent in resistance to electrolytic corrosion and storage stability, and is effective for producing printed wiring boards by the additive process.

What is claimed is:

1. An adhesive composition for printed wiring boards wherein necessary circuit patterns are formed by electroless plating comprising effective adhesive amounts of
   (A) acrylonitrile-butadiene rubber having carboxyl groups in the molecule and containing 20 ppm or less of metal ionic impurities, based on weight,
   (B) an alkyl phenol resin,
   (C) an epoxy resin,
   (D) a catalyst for electroless plating selected from metallic palladium or a salt thereof, or a mixture thereof, and
   (E) a coupling agent having an ethylene group or a vinyl group.

2. An adhesive composition according to claim 1, wherein the component (A) is contained in an amount of 30 to 70% by weight, the component (B) is contained in an amount of 10 to 40% by weight, the component (C) is contained in an amount of 5 to 50% by weight, the component (D) is contained in an amount of 1 to 10% by weight, and the weight ratio of (D)/(E) is in the range of 10/0.05 to 10/5.

3. An adhesive composition according to claim 1, wherein the component (E) is diisostearoyl ethylene titanate or bis(dioctyl pyrophosphate) ethylene titanate.

4. A printed wiring board produced by forming an adhesive layer on an insulating substrate containing a catalyst for electroless plating with an adhesive composition comprising effective adhesive amounts of
   (A) acrylonitrile-butadiene rubber having carboxyl groups in the molecule and containing 20 ppm or less of metal ionic impurities, based on weight,
   (B) an alkyl phenol resin,
   (C) an epoxy resin,
   (D) a catalyst for electroless plating selected from metallic palladium or a salt thereof, or a mixture thereof, and
   (E) a coupling agent having an ethylene group or a vinyl group, masking portions other than the circuit portions with a resist, chemically roughening non-masked portions, and conducting electroless plating; said printed circuit board exhibiting excellent resistance to electrolytic corrosion.

* * * * *